United States Patent [19]

McClenahan et al.

[11] 4,390,796
[45] Jun. 28, 1983

[54] VOLTAGE TO DUTY CYCLE CONVERTER

[75] Inventors: Robert W. McClenahan, Philadelphia; Thomas J. Walsh, Hatboro, both of Pa.

[73] Assignee: Leeds & Northrup Co., North Wales, Pa.

[21] Appl. No.: 254,797

[22] Filed: Apr. 15, 1981

[51] Int. Cl.³ .......................... H03K 5/00; H03L 7/00
[52] U.S. Cl. .................................... 307/261; 307/271; 331/111; 331/143; 340/347 AD; 340/347 M
[58] Field of Search .... 340/347 M, 347 NT, 347 AD; 328/146, 129; 324/60 CD; 307/234, 261, 271; 331/111, 143

[56] References Cited

U.S. PATENT DOCUMENTS

| | | | |
|---|---|---|---|
| 3,462,758 | 8/1969 | Reynal et al. | 340/347 AD |
| 3,599,203 | 8/1971 | Conley | 340/347 NT |
| 3,718,864 | 2/1973 | Kelly et al. | 328/146 X |
| 4,151,464 | 4/1979 | Cooper | 340/347 AD X |

Primary Examiner—T. J. Sloyan

Attorney, Agent, or Firm—William G. Miller, Jr.; Harold Huberfeld; Frank J. Thomas

[57] ABSTRACT

An analog voltage to duty cycle converter is provided using a series connected resistor and capacitor. The capacitor is charged in one direction through the resistor from the difference between the analog voltage and a reference voltage maintained across a zener diode by one polarity of output from a differential amplifier responding to the charge across the capacitor. When the charge across the capacitor reaches the difference necessary to cause the differential amplifier to change the polarity of its output, a positive feedback firmly toggles the output to the other polarity and the capacitor is allowed to charge in the opposite direction due to cutoff of the zener current by a diode in the amplifier output circuit. The capacitor then charges in an opposite direction due to the analog voltage alone and the reference voltage again switches "on" when the amplifier output goes positive. The duty cycle is then proportional to the analog voltage.

8 Claims, 2 Drawing Figures

VOLTAGE TO DUTY CYCLE CONVERTER

BACKGROUND OF THE INVENTION

Analog to digital converters usually require precision resistors or capacitors and switches. Such elements tend to unduly increase the cost of those converters as does the need for large power supplies. In applications using microprocessors the possibility of using the microprocessor for counting time presents itself. It is therefore an object of this invention to provide apparatus for producing in a simple, accurate and economical way a digital representation of an analog voltage when a microprocessor is available to provide the counting function.

SUMMARY OF THE INVENTION

A voltage to duty cycle converter is provided for producing a digital representation of an analog voltage. The circuit includes a series connected capacitor and resistor charged over a voltage range from a reference voltage source which can be disconnected or shorted for discharge of the capacitor over that range. The duty cycle of this switching is proportional to the analog voltage. The charging period is terminated when the capacitor takes a charge which exceeds the analog voltage by a small amount. At that time a detector responds to that difference by switching the reference voltage source off or by shorting it so that the capacitor discharges to decrease the charge by the same small amount below the analog voltage at which time the reference voltage source is switched back on or reconnected and another cycle begins.

DESCRIPTION OF THE PREFERRED EMBODIMENT

The conversion of an analog voltage to a digital representation, such as the duty cycle of a waveform, is a function which has many uses. Among them is its use to convert an analog position; for example, a slidewire contact position on an analog recording instrument. It is desirable in some instances to make this conversion for the purpose of further processing of the resulting digital representation as in a microprocessor. For example, when the slidewire contact is in a rebalanceable recorder used for measuring industrial process variables, the microprocessor may be programmed to provide alarm functions.

Figure 1:
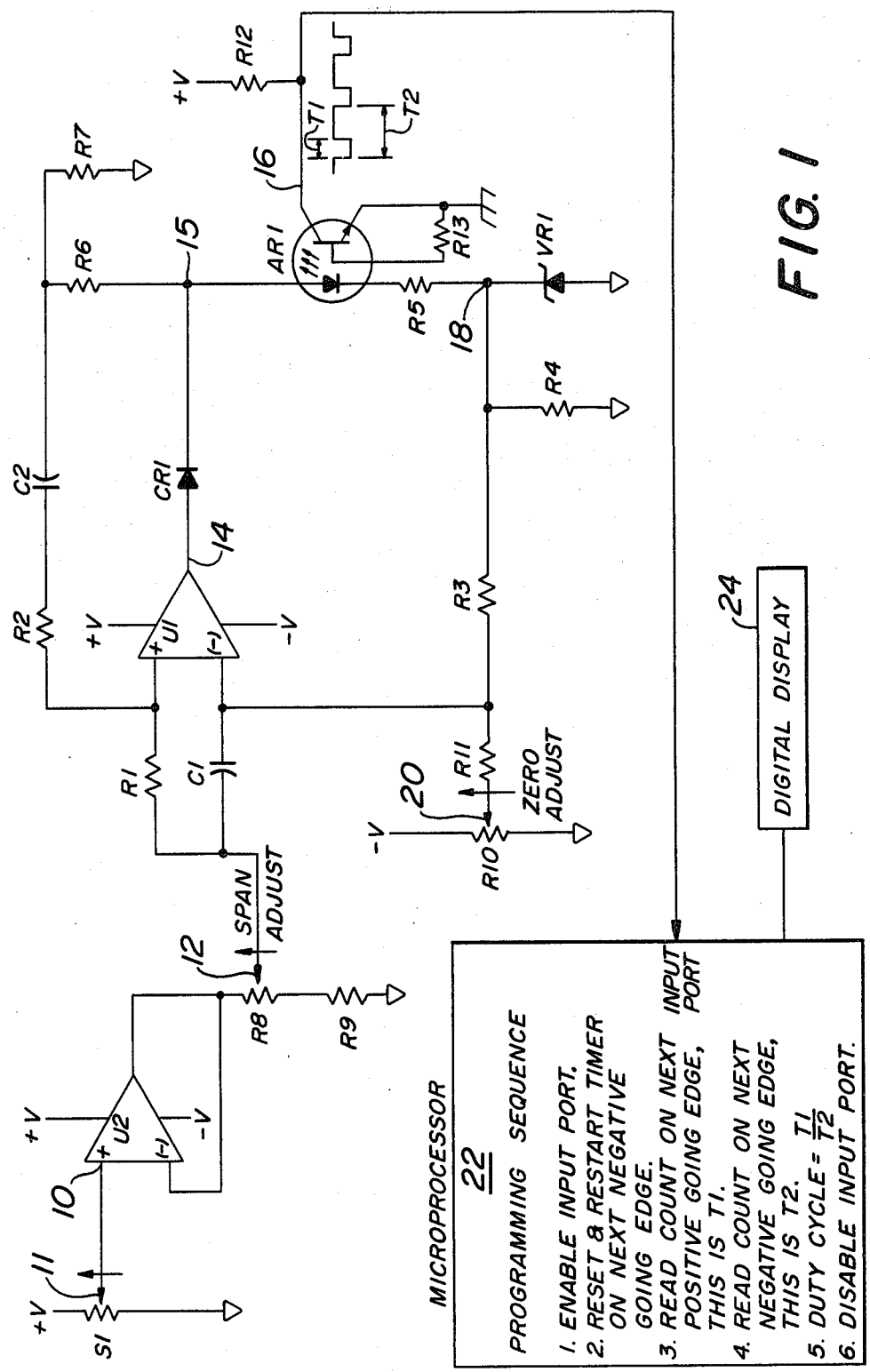
FIG. 1 is a circuit diagram of one form of the invention.

In FIG. 1 the slidewire S1 may be a slidewire whose contact is positioned in accordance with a process measurement. The slidewire is supplied from a power supply at a voltage $+V$ so that the input to the non-inverting input 10 of a buffer amplifier U2 is a varying analog voltage which must be converted to digital form for processing.

The amplifier U2 is supplied by power supplies $+V$ and $-V$ and has its output connected to its inverting input so that the output voltage closely follows the input voltage.

The potentiometer R8 and resistor R9 provide a span adjustment when connected as shown in FIG. 1 so that only a portion of the buffer amplifier output is used. By the span adjustment, the range of voltages over which the variable input will change during full travel of the potentiometer contact 11 is determined.

The tap 12 of the potentiometer R8 is fed through an input resistor R1 to the non-inverting input of a differential amplifier U1. A positive voltage on this input causes the output line 14 to be positive if we assume that any signal to the inverting input is less than the input provided from contact 12. The diode CR1 is conductive for positive amplifier outputs on line 14 so that a current flows in the output circuit for amplifier U1 under these conditions.

The output circuit includes an optical isolator AR1 connected in series with a resistor R5 and a zener diode VR1 so that a reference voltage of constant value is produced across VR1 with any variations in the output of U1 appearing across resistor R5. The current in the optical isolator AR1 then provides an output on output line 16 which is an inverted form of the output on line 14. The output on line 16 is thus zero when 14 is positive.

The difference between the analog voltage and the oppositely poled potential across VR1 of greater magnitude causes a charging in one direction of capacitor C1 by virtue of the resulting current flow through the series circuit including resistor R3 and capacitor C1 and the analog voltage input across R9 and the lower part of R8. The capacitor C1 is connected to the inverting input of amplifier U1 so that when capacitor C1 charges to a value which places the inverting input of U1 at a small voltage above that at the non-inverting input, the output on line 14 will go negative. The small voltage is that magnitude of unbalance required at the inputs to reach one limit of the dead band of U1 so as to reverse the polarity of the output of U1. CR1 will then be back-biased, output current flow from U1 will cease and the voltage across VR1 will go to zero. When this occurs the positive feedback provided by the series circuit including capacitor C2 and resistor R2 connected to line 14 through resistor R6 causes the potential at the non-inverting input of U1 to decrease. The result will be a firm toggle action for U1 as its output goes negative with a resulting clean waveform.

Since a negative output from U1 cuts off current flow through AR1, the ouput on line 16 will go from zero to $+V$. This positive going edge will occur at a time period T1 after the previous negative going edge, which period is a function of the magnitude of the input voltage since C1 will have been charged over a portion of its charging curve which is determined by the magnitude of the input voltage.

Also, with a negative output from U1 the capacitor C1 will charge in the other direction (also referred to as a discharge) through resistor R3 and resistor R4 which shunts VR1, all due to the analog voltage at contact 12. R4 is preferably as small as practicable so that the resistance of the discharge path substantially equals the resistance of the charging path. The potential at the inverting input of U1 will then fall until it reaches a potential which is a small voltage below the potential of the input to the non-inverting input of U1 thus reaching the other limit of the dead band. At that time, which is after a period T2 from the start of the cycle, the output of amplifier U1 will again go positive and current will again flow through optical isolator AR1 to produce a negative going edge to the waveform of the signal on line 16 at the isolator output thus starting another cycle in the continuing oscillation of U1.

As seen in FIG. 1, the inverting input to amplifier U1 is connected through resistor R11 to a contact 20 on potentiometer R10 which has one side supplied from a potential source −V and the other side tied to a circuit common. This arrangement provides a means for adjusting the zero for the range of variations spanned by the input from contact 12.

The circuit of FIG. 1 serves to provide a high degree of noise immunity from the input signal. A proportion of the noise at the input as determined by the voltage divider action of R1, R2, C2, and R7 is applied to the non-inverting input of U1. The same proportion of input noise, determined by the voltage divider action of C1, R3, and R4 is applied to the inverting input of U1. Since the two noises are equal, they cancel at power line frequency.

As the voltage at tap 12 increases the difference between it and the voltage across VR1 gets smaller so that more time is needed for the part of the cycle when line 14 is positive and AR1 is "on."

AR1 optically couples the output of U1 to the microprocessor 20. The waveform of the output of U1 is thus repeated in inverted form on line 16 since the transistor of AR1 is conductive during the positive portions of the cycle on the output line 14. The transistor of AR1 is connected to the +V supply by way of R12 with the emitter connected to earth ground and the base connected to the emitter by way of the base bias resistor R13. AR1 may be replaced by optical isolators configured as a Darlington pair if increased output is desired.

The waveform of the voltage on line 16 is shown beside that line in FIG. 1. In that waveform the negative going edge of the cycle is the start of the time periods which are measured. The time to the positive going edge is T1 and the time to the next negative going edge is T2. The microprocessor is programmed to read the count at those points and to calculate from those readings the ratio T1/T2 which is the duty cycle of the waveform on line 16. The value of the duty cycle is proportional to the analog voltage at tap S1 and hence is an indication of that value. The duty cycle value may be used in a program in the microprocessor as may be desired for alarming functions, for example. Alternatively, of course, the value may be displayed in digital display 24.

Figure 2:
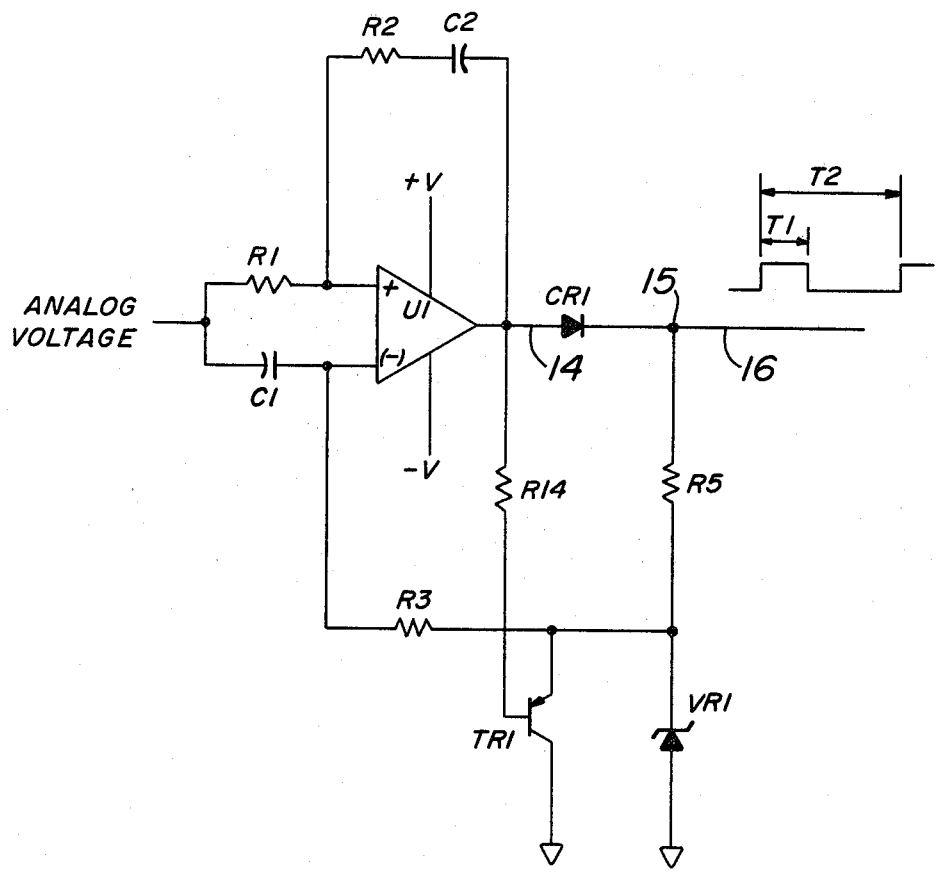
FIG. 2 is a circuit diagram of another form of the invention.

A variation of the circuit of the FIG. 1 is shown in FIG. 2. In FIG. 2 the isolator AR1 has been omitted indicating that electrical isolation is not required. Thus, the line 16 is directly connected to junction 15 when AR1 is omitted.

In FIG. 2 the resistor R4 of FIG. 1 is replaced by a transistor TR1 which serves to provide a conducting path for the charging of capacitor C1 by the analog voltage when the negative output from U2 on line 14 causes TR1 to be biased "on" by virtue of the resistor R14 connecting the base of TR1 to the output line 14.

With the arrangement of FIG. 2 the positive feedback network including R2 and C2 does not include R6 and R7 as shown in FIG. 1.

The differential amplifier U1 in both FIG. 1 and FIG. 2 is a detecting means for detecting the relationship between the input voltage to be converted and the sum of that voltage plus the negative feedback supplied by the voltage across C1 so that the switching means CR1 and R5 in FIG. 1 serves to switch the voltage source VR1 into and out of the circuit. Also, it will be evident that R5 and VR1 will be a switch means for turning the voltage source VR1 "on" in FIG. 2 while transistor TR1 in FIG. 2 will be the switch means for turning the voltage source VR1 "off."

Other than the changes just mentioned, the circuit of FIG. 2 operates substantially as set forth for FIG. 1.

It will be evident that other variations in the circuit of FIG. 1 may be made. For example, the capacitor C1 may have its one terminal connected to circuit common instead of to contact 12 as shown in FIG. 1. With such a change, the capacitor will discharge without the benefit of current flow due to the analog voltage. However, the capacitor itself will have a greater voltage difference in that the difference will include not only the small voltage required to switch but also the analog voltage magnitude. Still other changes will be evident to those skilled in the art including, for example, changes in the polarities.

In carrying out this invention, the parameters of the circuits of FIGS. 1 and 2 may be as set forth below:

FIG. 1

| Component | Value | Type |
|---|---|---|
| R1 | 33K | |
| R2 | 3.3M | |
| R3 | 1M | |
| R4 | 4.7K | |
| R5 | 470Ω | |
| R6 | 39K | |
| R7 | 10K | |
| R8 | 10K | |
| R9 | 22K | |
| R10 | 10K | |
| R11 | 10M | |
| R12 | 10K | |
| R13 | 330K | |
| U1 | | 308A |
| U2 | | 741 |
| AR1 | | 4N26 |
| VR1 | | 1N825A |
| CR1 | | 1N914 |
| C1 | .22 μf | |
| C2 | .05 μf | |

FIG. 2

| Component | Value | Type |
|---|---|---|
| R1 | .33K | |
| R2 | 3.3M | |
| R3 | 1M | |
| R5 | 470Ω | |
| R14 | 10K | |
| U1 | | 308 |
| CR1 | | 1N446 |
| TR1 | | 2N3638 |
| AR1 | | 4N26 |
| C1 | .22 μf | |
| C2 | 100 pf. | |

What is claimed is:

1. A converter for converting an analog voltage to a duty cycle comprising:
    a capacitor
    a resistor connected at one terminal to said capacitor to form a series circuit;
    a differential amplifier;
    a reference voltage source provided by a zener diode supplied by current from the output of said differential amplifier;
    switching means including a series connected diode and resistor in circuit connecting said zener diode to the output of said differential amplifier so that outputs of one polarity cause a fixed voltage to be maintained across said zener diode with outputs of opposite polarity being disconnected from said zener diode by said diode, said switching means being operative to selectively pass charging current through said series circuit from said reference voltage source in one state and for disconnecting said source to discharge said capacitor through said resistor in another state; and detecting means including said differential amplifier whose inverting input is connected to said terminal and whose non-inverting input is connected to receive both said analog voltage through an input resistor and a positive feedback signal from the output of said amplifier by way of a series resistance-capacitance network connecting said output to said non-inverting input, said detecting means being responsive solely to the difference between said analog voltage and the voltage at said terminal for causing said switching means to go from said one state to said other when said difference reaches a certain magnitude of one polarity and to reverse states when said difference reaches said magnitude in an opposite polarity, whereby the duty cycle of the resulting oscillations is proportional to the value of said analog voltage.

2. A converter for converting an analog voltage to a duty cycle comprising:

a capacitor;

a resistor connected at one terminal to said capacitor to form a series circuit;

a differential amplifier;

a reference voltage source provided by a zener diode supplied by current from the output of said differential amplifier;

switching means including a series connected diode and resistor in circuit connecting said zener diode to the output of said differential amplifier so that outputs of one polarity cause a fixed voltage to be maintained across said zener diode with outputs of opposite polarity being disconnected from said zener diode by said diode and a transistor for providing a conductive path to discharge said capacitor through said resistor when said transistor is biased to the conductive state in response to said opposite polarity outputs, said switching means being operative to selectively pass charging current through said series circuit from said reference voltage source in one state and for disconnecting said source to discharge said capacitor through said resistor in another state; and detecting means including said differential amplifier whose inverting input is connected to said terminal and whose non-inverting input is connected to receive both said analog voltage through an input resistor and a positive feedback signal from the output of said amplifier by way of a series resistance-capacitance network connecting said output to said non-inverting input, said detecting means being responsive solely to the difference between said analog voltage and the voltage at said terminal for causing said switching means to go from said one state to said other when said difference reaches a certain magnitude of one polarity and to reverse states when said difference reaches said magnitude in an opposite polarity, whereby the duty cycle of the resulting oscillations is proportional to the value of said analog voltage.

3. A converter for converting an analog voltage to a duty cycle comprising:

a capacitor;

a resistor connected at one terminal to said capacitor to form a series circuit;

a differential amplifier;

a reference voltage source provided by a zener diode supplied by current from the output of said differential amplifier;

switching means including a series connected diode and resistor in circuit connecting said zener diode to the output of said differential amplifier so that the output current of said amplifier is conducted through the diode portion of an optical isolator to produce conduction of the transistor portion for producing an output waveform therefrom and so that outputs of one polarity cause a fixed voltage to be maintained across said zener diode with outputs of opposite polarity being disconnected from said zener diode by said diode, said switching means being operative to selectively pass charging current through said series circuit from said reference voltage source in one state and for disconnecting said source to discharge said capacitor through said resistor in another state; and detecting means including said differential amplifier whose inverting input is connected to said terminal and whose non-inverting input is connected to receive both said analog voltage through an input resistor and a positive feedback signal from the output of said amplifier by way of a series resistance-capacitance network connecting said output to said non-inverting input, said detecting means being responsive solely to the difference between said analog voltage and the voltage at said terminal for causing said switching means to go from said one state to said other when said difference reaches a certain magnitude of one polarity and to reverse states when said difference reaches said magnitude in an opposite polarity, whereby the duty cycle of the resulting oscillations is proportional to the value of said analog voltage.

4. A converter for converting an analog voltage to a duty cycle comprising:

a capacitor;

a resistor connected at one terminal to said capacitor to form a series circuit;

a differential amplifier;

a reference voltage source provided by a zener diode supplied by current from the output of said differential amplifier;

switching means including a series connected diode and resistor in circuit connecting said zener diode to the output of said differential amplifier so that outputs of one polarity cause a fixed voltage to be maintained across said zener diode with outputs of opposite polarity being disconnected from said zener diode by said diode; a transistor for providing a conductive path to discharge said capacitor through said resistor when said transistor is biased to the conductive state, said switching means being operative to selectively pass charging current through said series circuit from said reference voltage source in one state and for disconnecting said source to discharge said capacitor through said resistor in another state; and detecting means including said differential amplifier whose output current is conducted through the diode portion of an optical isolator so as to produce conduction of the transistor portion for producing an output waveform therefrom, and whose inverting input is connected to said terminal with the non-inverting input connected to receive both said analog voltage through an input resistor and a positive feedback signal from the output of said amplifier by way of a series resistance-capacitance network connecting said output to said non-inverting input, said detecting means being responsive solely to the difference between said analog voltage and the voltage at said terminal for causing said switching means to go from said one state to said other when said difference reaches a certain magnitude of one polarity and to reverse states when said difference reaches said magnitude in an opposite polarity, whereby the duty cycle of the resulting oscillations is proportional to the value of said analog voltage.

5. A converter for converting an analog voltage to a duty cycle comprising:
a capacitor;
a resistor connected at one terminal to said capacitor to form a series circuit;
a differential amplifier;
a reference voltage source provided by a zener diode supplied by current from the output of said differential amplifier;
switching means including a series connected diode and resistor in circuit connecting said zener diode to the output of said differential amplifier so that the output current of said amplifier is conducted through the diode portion of an optical isolator so as to produce conduction of the transistor portion for producing an output waveform as an input to a microprocessor programmed to calculate the duty cycle of said waveform and so that outputs of one polarity cause a fixed voltage to be maintained across said zener diode with outputs of opposite polarity being disconnected from said zener diode by said diode;
detecting means including said differential amplifier whose inverting input is connected to said terminal and whose non-inverting input is connected to receive both said analog voltage through an input resistor and a positive feedback signal from the output of said amplifier by way of a series resistance-capacitance network connecting said output to said non-inverting input, said detecting means being responsive solely to the difference between said analog voltage and the voltage at said terminal for causing said switching means to go from said one state to said other when said difference reaches a certain magnitude of one polarity and to reverse states when said difference reaches said magnitude in an opposite polarity, whereby the duty cycle of the resulting oscillations is proportional to the value of said analog voltage.

6. A converter for converting an analog voltage to a duty cycle comprising:
a capacitor;
a resistor connected at one terminal to said capacitor to form a series circuit;
a differential amplifier;
a reference voltage source provided by a zener diode supplied by current from the output of said differential amplifier;
switching means including a series connected diode and resistor in circuit connecting said zener diode to the output of said differential amplifier so that outputs of one polarity cause a fixed voltage to be maintained across said zener diode with outputs of opposite polarity being disconnected from said zener diode by said diode, and a transistor for providing a conductive path to discharge said capacitor through said resistor when said transistor is biased to the conductive state, said switching means being operative to selectively pass charging current through said series circuit from said reference voltage source in one state and for disconnecting said source to discharge said capacitor through said resistor in another state; and
detecting means including said differential amplifier whose output is conducted through the diode portion of an optical isolator so as to produce conduction of the transistor portion for producing an output waveform as an input to a microprocessor programmed to calculate the duty cycle of said waveform to produce in digital form a signal representing the magnitude of said analog voltage, said detecting means being responsive solely to the difference between said analog voltage and the voltage at said terminal for causing said switching means to go from said one state to said other when said difference reaches a certain magnitude of one polarity and to reverse states when said difference reaches said magnitude in an opposite polarity, whereby the duty cycle of the resulting oscillations is proportonal to the value of said analog voltage.

7. A voltage to duty cycle converter comprising:
a differential amplifier for producing on its output a waveform whose duty cycle is proportional to the analog voltage connected to its non-inverting input;
an input resistor for connecting said analog voltage to said input;
a negative feedback path connecting the output of said amplifier to the inverting input, said negative feedback path including
a series circuit having a first diode connected to pass amplifier output current in turn through a first series connected resistor, a second series connected resistor, and a capacitor to circuit common,
a zener diode connected to maintain constant during conduction of said first diode, the potential with respect to circuit common of that terminal of said second resistor connected to said first resistor,
a resistor connected in parallel to said zener diode to provide a discharge path for said capacitor,
means connecting the junction between the second series resistor and said capacitor to the inverting input of said amplifier; and
a positive feedback circuit connecting the non-inverting input to that junction of said first diode opposite the junction connected to the amplifier output, said positive feedback circuit having a series connected resistor and capacitor.

8. A voltage to duty cycle converter for producing an electrically isolated digital representation of an analog voltage comprising:
a differential amplifier having an analog voltage supplied to its non-inverting input;

a negative feedback path connected from the output of said amplifier to the inverting input, said negative feedback path including
an optical isolator connected in series with a zener diode, and
a series connected capacitor and resistor across said diode with the junction between said resistor and capacitor being connected to said inverting input so that current through the isolator and diode establish a voltage across the diode such that the capacitor is charged to cause the potential at the inverting input of said amplifier to rise above that of said analog voltage by a small amount and then upon reversal of the amplifier output voltage conduction of the optical isolator is stopped and the capacitor discharges causing the potential at the inverting input to fall to a small potential below that of said analog voltage at which point the cycle is complete and the amplifier output again reverses to start another cycle by charging the capacitor again so that the current through said optical isolator has a duty cycle proportional to said analog voltage;
a series connected capacitor and resistor forming a positive feedback circuit connecting the output of said amplifier to the non-inverting input so that the waveform of the output from the amplifier is clean at the cross-over points; and
a microprocessor connected to the output of said optical isolator, said microprocessor being programmed to calculate the ratio of the time period during which the output of the amplifier is positive to the total time period of each cycle of the amplifier output as an indication of the magnitude of said analog voltage.

* * * * *